(12) United States Patent
Ohguro

(10) Patent No.: US 8,154,089 B2
(45) Date of Patent: Apr. 10, 2012

(54) SEMICONDUCTOR DEVICE

(75) Inventor: Tatsuya Ohguro, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 295 days.

(21) Appl. No.: 12/274,725

(22) Filed: Nov. 20, 2008

(65) Prior Publication Data

US 2009/0127625 A1 May 21, 2009

(30) Foreign Application Priority Data

Nov. 21, 2007 (JP) ................................ 2007-301747

(51) Int. Cl.
*H01L 27/088* (2006.01)
(52) U.S. Cl. ......................... 257/401; 257/417; 257/365
(58) Field of Classification Search .................. 257/403, 257/417, 365
See application file for complete search history.

(56) References Cited

U.S. PATENT DOCUMENTS

| 6,140,687 | A | 10/2000 | Shimomura et al. | |
|---|---|---|---|---|
| 6,777,756 | B2 | 8/2004 | Ohguro | |
| 2004/0108523 | A1 | 6/2004 | Chen et al. | |
| 2005/0191795 | A1 | 9/2005 | Chidambarrao et al. | |
| 2007/0075342 | A1 | 4/2007 | Kanemura | |
| 2007/0132039 | A1* | 6/2007 | Doris et al. | 257/401 |
| 2008/0023742 | A1 | 1/2008 | Lee | |

FOREIGN PATENT DOCUMENTS

JP 10-214971 8/1998

* cited by examiner

*Primary Examiner* — Michael Shingleton
(74) *Attorney, Agent, or Firm* — Oblon, Spivak, McClelland, Maier & Neustadt, L.L.P.

(57) ABSTRACT

A semiconductor device according to one embodiment includes: a substrate; a plurality of fins made of a semiconductor and formed on the substrate; a plurality of via contact regions formed between the fins, the plurality of via contact regions and the plurality of the fins constituting a closed loop structure; a gate contact region on the substrate arranged at a position surrounded by the closed loop structure; a plurality of gate electrodes connected to the gate contact region respectively, each of the plurality of gate electrodes sandwiching both side faces of each of the plurality of fins between its opposite regions via gate insulating film; and source/drain regions formed in regions in the plurality of fins and in the contact region, the regions being formed on both sides of a region sandwiched by the gate electrodes along longitudinal direction of the fin.

20 Claims, 6 Drawing Sheets

SEMICONDUCTOR DEVICE

CROSS-REFERENCE TO RELATED APPLICATIONS

This application is based upon and claims the benefit of priority from prior Japanese Patent Application No. 2007-301747, filed on Nov. 21, 2007, the entire contents of which are incorporated herein by reference.

BACKGROUND

As one of double-gate type transistors having a structure in which a channel region is sandwiched by a gate electrode for enhancing current controllability by the gate electrode, there is a FinFET (Fin Field Effect Transistor) which is a transistor having a fin structure. In the FinFET, it is important to reduce a width of a fin.

However, since a gate width is also reduced when the width of the fin is reduced, a sufficient drive current may not be obtained. For solving this problem, a FinFET in which a plurality of fins arranged in parallel are formed and a substantial gate width is increased, has been known. This FinFET, for example, is disclosed in JP2007-103455.

BRIEF SUMMARY

A semiconductor device according to one embodiment includes: a substrate; a plurality of fins made of a semiconductor and formed on the substrate; a plurality of via contact regions formed between the fins, the plurality of via contact regions and the plurality of the fins constituting a closed loop structure; a gate contact region on the substrate arranged at a position surrounded by the closed loop structure; a plurality of gate electrodes connected to the gate contact region respectively, each of the plurality of gate electrodes sandwiching both side faces of each of the plurality of fins between its opposite regions via gate insulating film; and source/drain regions formed in regions in the plurality of fins and in the contact region, the regions being formed on both sides of a region sandwiched by the gate electrodes along longitudinal direction of the fin.

DETAILED DESCRIPTION

First Embodiment

Figure 1:
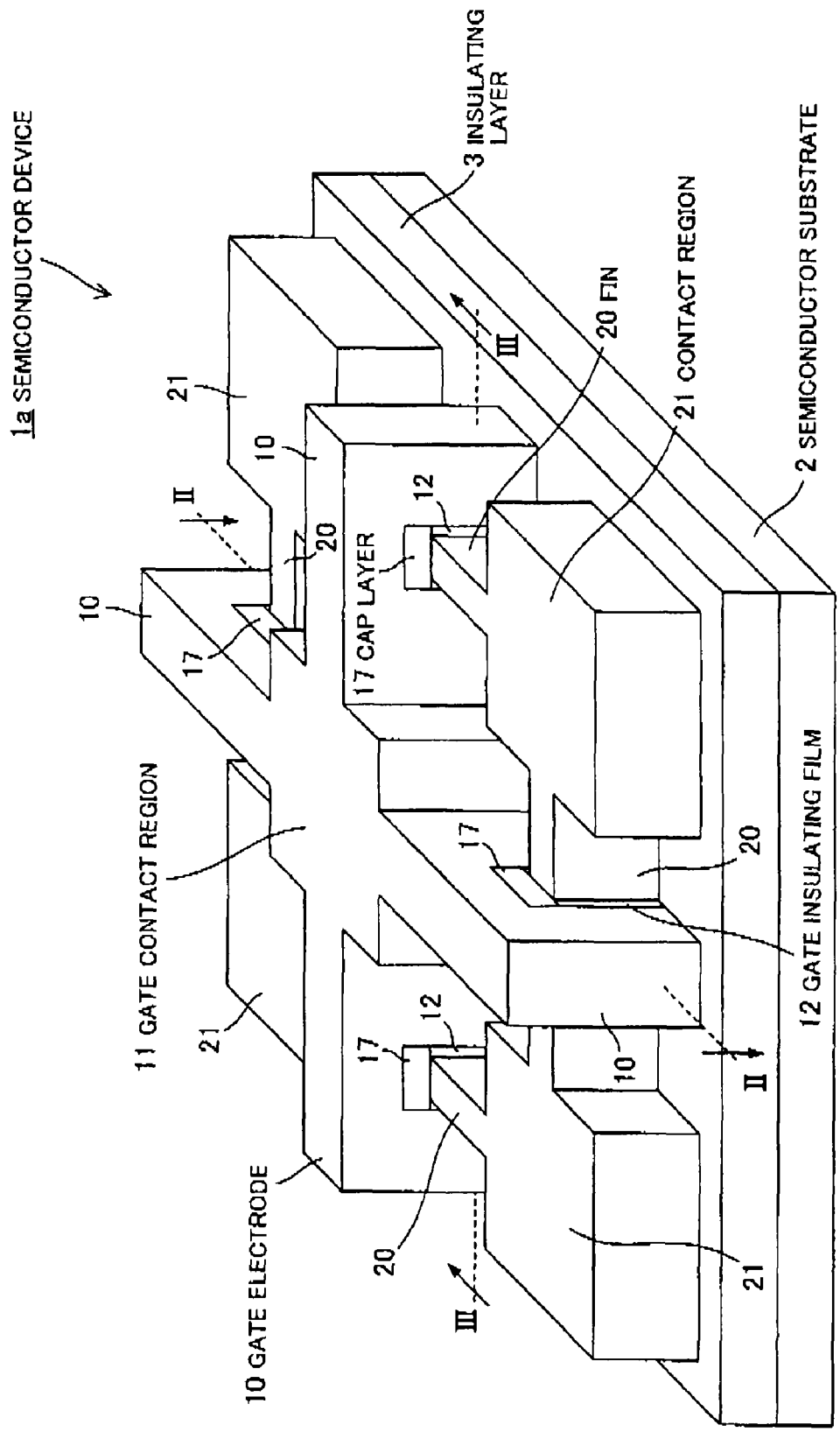
FIG. 1 is a perspective view of a semiconductor device according to a first embodiment.
Figure 2:
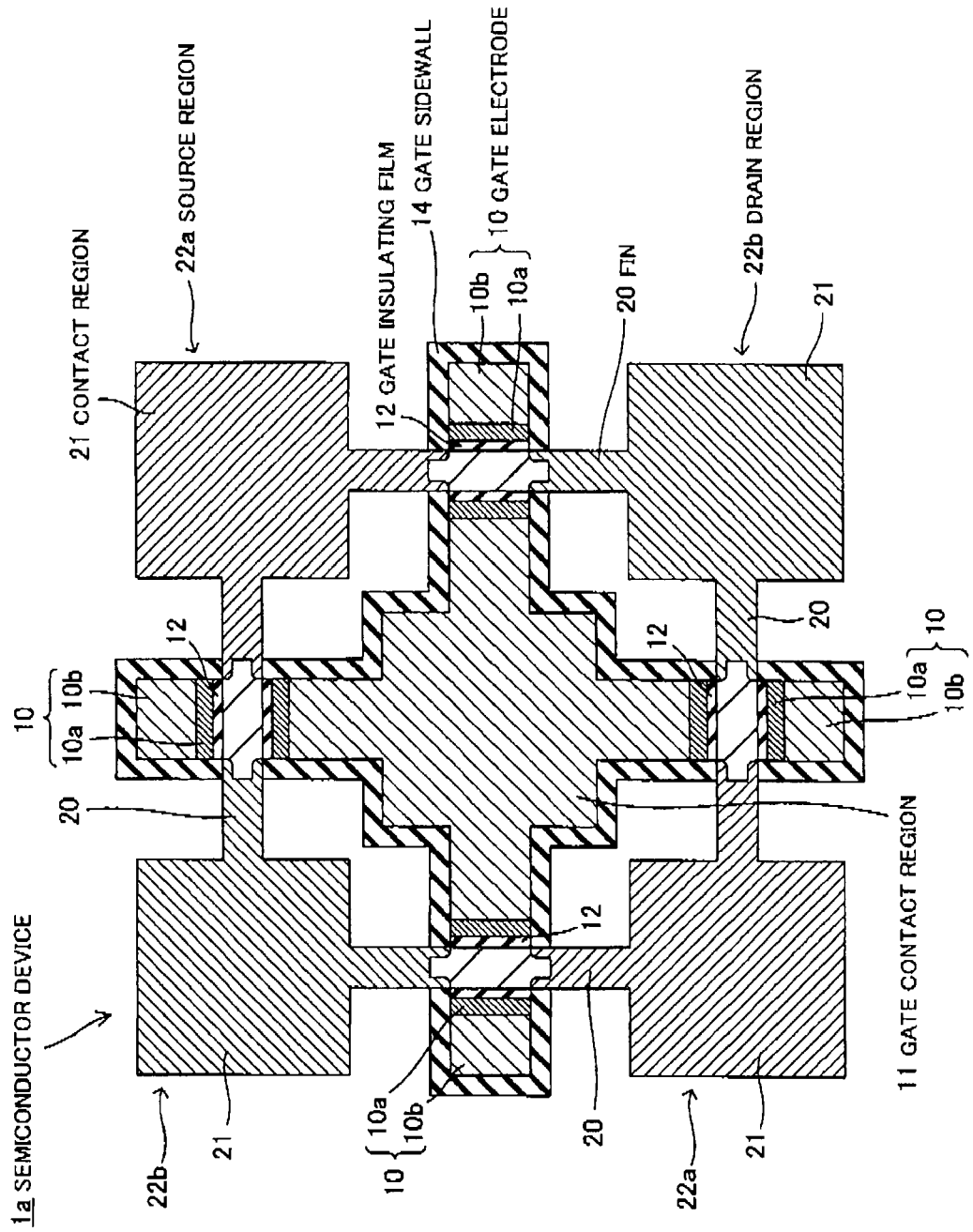
FIG. 2 is a cross sectional view when a cut surface taken on line II-II of FIG. 1 is viewed in a direction indicated by an arrow in the figure.
Figure 3:
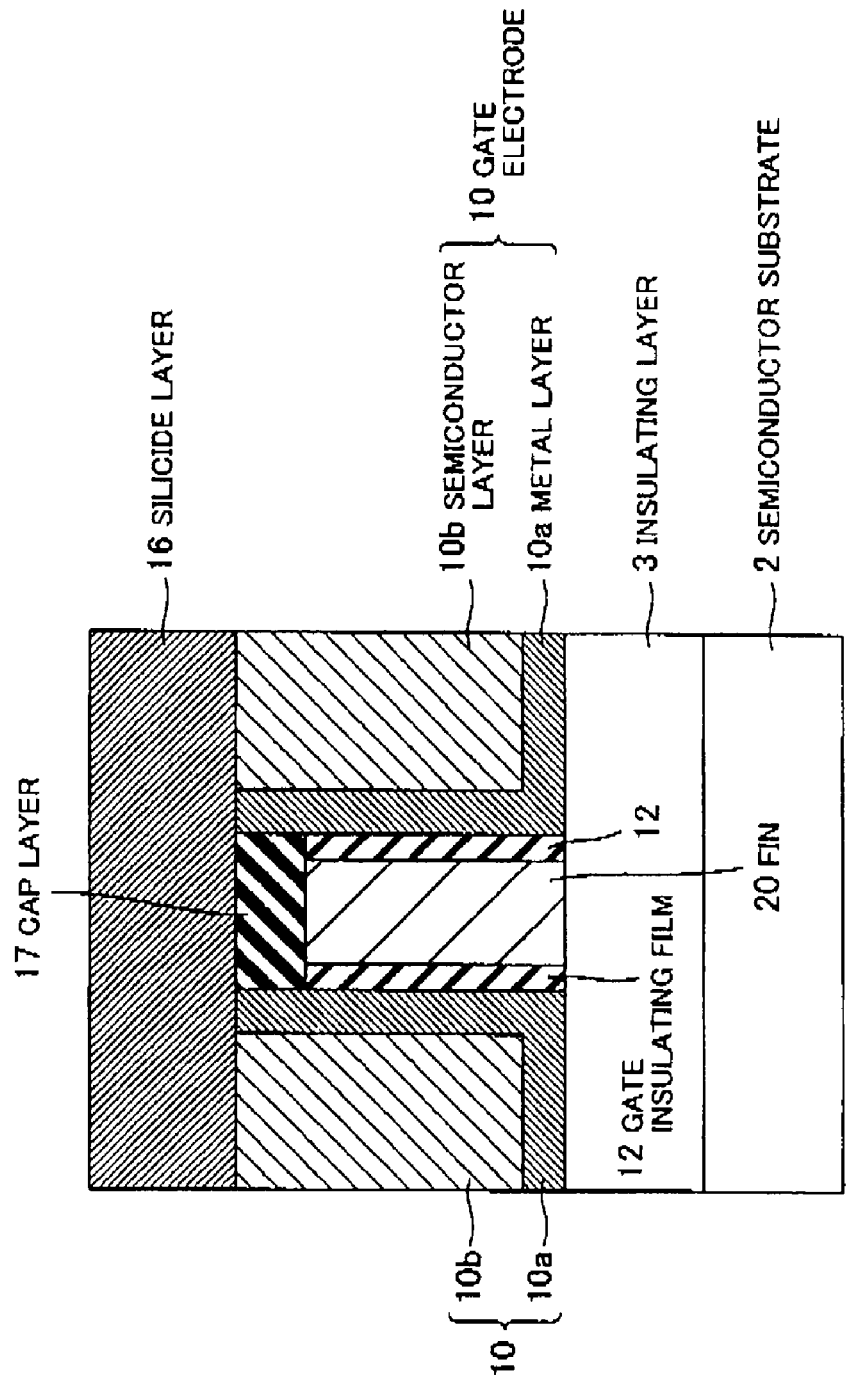
FIG. 3 is a cross sectional view when a cut surface taken on line III-III of FIG. 1 is viewed in a direction indicated by an arrow in the figure.

FIG. 1 is a perspective view of a semiconductor device in a first embodiment. Furthermore, FIG. 2 is a cross sectional view when a cut surface taken on line II-II of FIG. 1 is viewed in a direction indicated by an arrow in the figure. Furthermore, FIG. 3 is a cross sectional view when a cut surface taken on line III-III of FIG. 1 is viewed in a direction indicated by an arrow in the figure.

A semiconductor device 1a is schematically configured to have a semiconductor substrate 2, an insulating layer 3 formed on the semiconductor substrate 2, four fins 20 formed on the insulating layer 3 and composing a closed loop structure by being continuously connected to one another via four contact regions 21, a gate contact region 11 arranged at a position surrounded by the four fins 20 composing the closed loop structure, four gate electrodes 10 formed so as to sandwich respective both side faces of each of the four fins 20 between its opposite regions via gate insulating film 12 and connected to the gate contact region 11 respectively, cap layers 17 formed between upper surfaces of the fins 20 and the gate electrodes 10, a gate sidewall 14 formed on side faces of the gate electrodes 10 and a silicide layer 16 formed on upper portions of the gate electrodes 10.

Note that, illustrations of metal layers 10a, semiconductor layers 10b, the gate sidewall 14, the silicide layer 16, source regions 22a and drain regions 22b are omitted in FIG. 1 to simplify.

For the semiconductor substrate 2, it is possible to use an Si substrate, a SiGe substrate or the like.

The insulating layer 3 has a function as an element isolation region and is composed of an insulating material such as $SiO_2$ or the like.

The fin 20 is composed of an Si-based single crystal such as a single-crystal Si, a single-crystal SiGe or the like. Furthermore, the fin 20 includes a source region 22a and a drain region 22b on both sides of a region surrounded by the gate electrode 10. A region, which is surrounded by the gate electrode 10 and sandwiched by the source region 22a and the drain region 22b, functions as a channel region.

For a conductivity type impurity contained in the source region 22a and the drain region 22b, a p-type impurity such as B, $BF_2$ or the like is used for a p-type transistor, and an n-type impurity such as As, P or the like is used for an n-type transistor.

It is preferable that distances between the gate contact region 11 and each fin 20 are substantially uniform.

The contact region 21 composed of the same material as the fin 20 is integrally formed with the fin 20, includes a portion of the source region 22a or the drain region 22b, and functions as a region for connecting a contact plug (not shown) which is connected to the source region 22a or the drain region 22b.

Each of the contact regions 21 includes the source region 22a or the drain region 22b being shared with FinFETs composed by two fins 20 adjacent to the each contact region 21 respectively. Furthermore, it is preferable that distance between each of the contact regions 21 and the gate electrodes 10 formed on the fins 20 adjacent to the each contact region 21 are substantially uniform.

The gate electrode 10 has a metal layer 10a composed of TiN, TaC or the like, and a semiconductor layer 10b formed on the metal layer 10a and composed of a Si-based polycrystalline, such as polycrystalline Si, polycrystalline SiGe or the like, containing a conductivity type impurity. For the conductivity type impurity contained in the semiconductor layer 10b, a p-type impurity is used for the p-type transistor, and an n-type impurity is used for the n-type transistor.

Furthermore, the gate electrode 10 may be composed of only the semiconductor layer 10b without including the metal layer 10a. Furthermore, in this case, the gate electrode 10 may be a full silicide electrode which is a fully-silicided semiconductor layer 10b.

The metal layer 10a may be made of W, Ta, Ti, Hf, Zr, Ru, Pt, Ir, Mo, Al or the like, or a compound thereof. Furthermore, the gate electrode 10 may be a metal gate electrode which is composed of only the metal layer 10a without including the semiconductor layer 10b. When the metal gate electrode is used, the silicide layer 16 is not formed.

Furthermore, the gate electrode 10 is preferably arranged so as to extend in a direction orthogonal to the fin 20 from the gate contact region 11.

The silicide layer 16 is composed of, for example, a compound of a metal such as Ni, Pt, Co, Er, Y, Yb, Ti, Pd, NiPt, CoNi or the like with Si, and is formed on the upper portion of the semiconductor layer 10b of the gate electrode 10.

The gate insulating film 12 is composed of, for example, $SiO_2$, SiN, SiON or a high-k material (for example, an Hf-based material such as HfSiON, HfSiO or HfO, a Zr-based material such as ZrSiON, ZrSiO or ZrO, and a Y-based material such as $Y_2O_3$ or the like).

The cap layer 17 is composed of an insulating material such as SiN or the like and has a function as a mask used for RIE (Reactive Ion Etching) to form the fin 20. Note that, it may be configured not to provide the cap layer 17 but to provide the gate insulating film 12 on an upper layer of the fin 20, and to form a channel also on the upper surface of the fin 20.

The gate sidewall 14 is composed of, for example, an insulating material such as SiN or the like. Furthermore, it may have a structure of two layers made of multiple types of insulating materials comprising SiN, $SiO_2$, TEOS (Tetraethoxysilane) or the like, furthermore, it may have a structure of three of more layers.

Figure 4A:
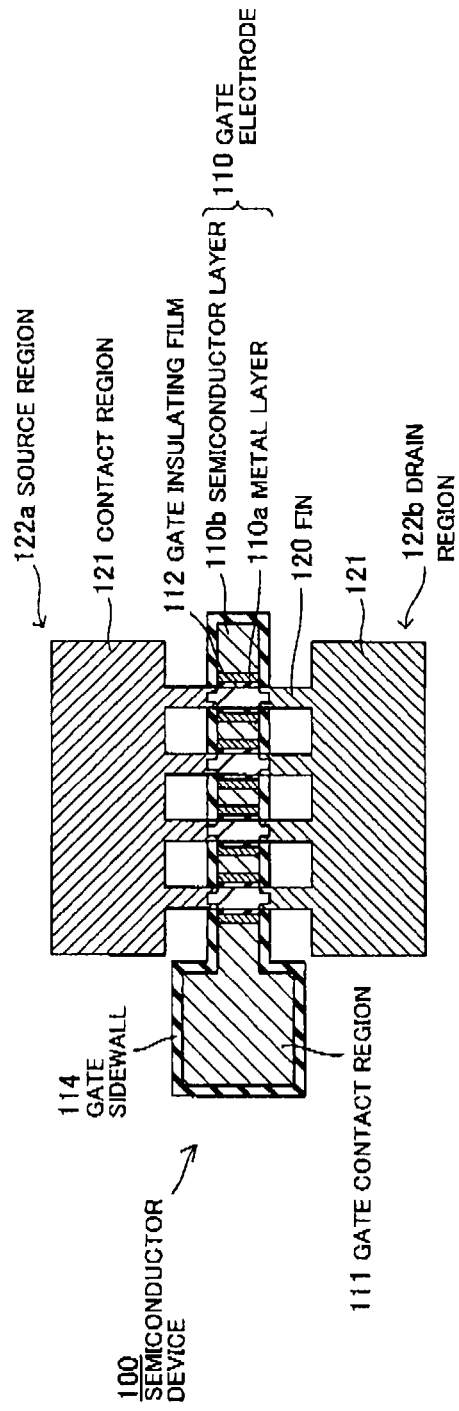
FIG. 4A and FIG. 4B are cross sectional views of a semiconductor device having a plurality of fins as comparative examples.
Figure 4B:
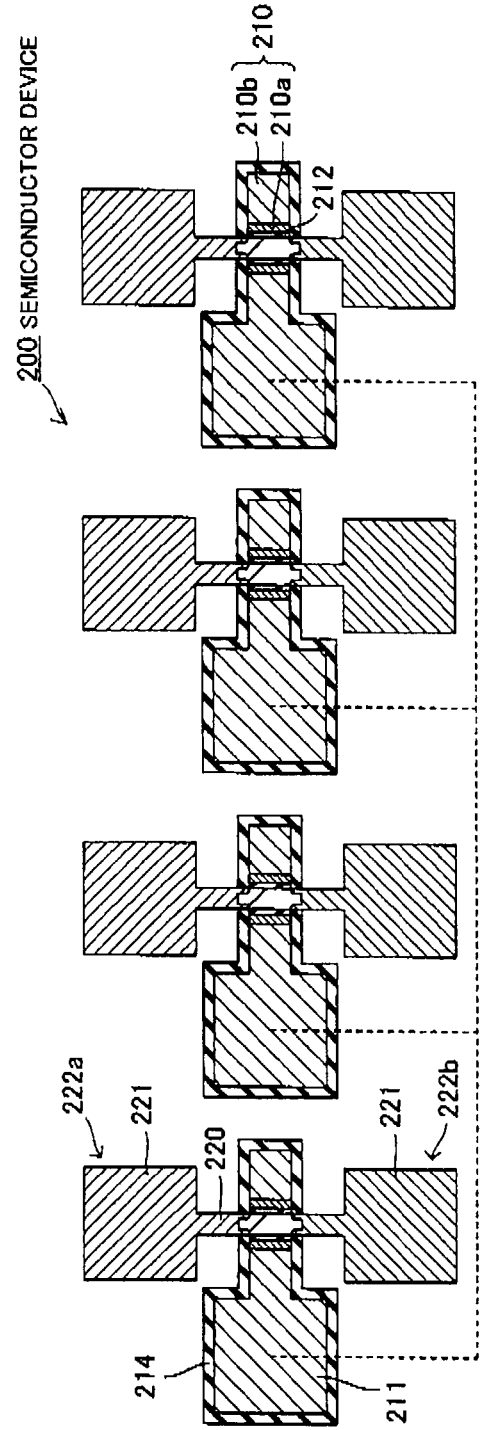

FIG. 4A and FIG. 4B are cross sectional views of a semiconductor device having a plurality of fins as comparative examples. Cross sections of the semiconductor devices 100 and 200 shown in FIG. 4A and FIG. 4B correspond to a cross section of the semiconductor device 1a according to this embodiment shown in FIG. 2.

A semiconductor device 100 shown in FIG. 4A has four fins similarly to the semiconductor device 1a according to this embodiment but is different from the semiconductor device 1a in that there is only one pair of source and drain regions. Other configurations are same as the semiconductor device 1a according to this embodiment.

A semiconductor device 200 shown in FIG. 4A has four fins similarly to the semiconductor device 1a according to this embodiment but is different from the semiconductor device 1a in that one gate contact region is formed for one gate electrode. Note that, four gate contact regions 211 of the semiconductor device 200 are electrically connected to each other. Other configurations are same as the semiconductor device 1a according to this embodiment.

Simulation calculations of a current gain cut-off frequency $f_T$ and a power gain cut-off frequency $f_{MAX}$ were carried out for the semiconductor device 1a according to this embodiment, the semiconductor device 100 as a comparative example shown in FIG. 4A and the semiconductor device 200 as a comparative example shown in FIG. 4B.

The current gain cut-off frequency $f_T$ is a frequency when a current gain being a ratio of an output current and an input current of a transistor becomes 1, and the higher this value is, the faster a switching operation of the transistor is. The current gain cut-off frequency $f_T$ can be represented by a following formula (1).

$$f_T = (1/2\pi) \times (g_m/C_{in}) \qquad (1)$$

Here, $g_m$ is transconductance and $C_{in}$ is a gate input capacitance. Note that, the gate input capacitance $C_{in}$ is a sum of all gate input capacitances including a parasitic capacitance generated in a member between a gate electrode and a fin, a substrate or the like, a fringe capacitance between a gate electrode and a fin, substrate or the like, an overlap capacitance and the like. Namely, it is possible to derive the current gain cut-off frequency $f_T$ by evaluating the gate input capacitance $C_{in}$.

The power gain cut-off frequency $f_{MAX}$ a frequency when a power gain being a ratio of output power and input power of a transistor becomes 1, and in the same way as the current gain cut-off frequency $f_T$, the higher this value is, the faster a switching operation of the transistor is. The power gain cut-off frequency $f_{MAX}$ can be represented by a following formula (2).

$$f_{max} = A(f_T/(R_g \times C_{gd}))^{1/2} \qquad (2)$$

Here, $R_g$ is gate resistance, $C_{gd}$ is a parasitic capacitance generated between the gate electrode and the drain region, and A is a proportional constant. Namely, it is possible to derive the power gain cut-off frequency $f_{MAX}$ by evaluating the gate resistance $R_g$ using the value of the current gain cut-off frequency $f_T$.

Following is a condition of the simulation calculation. The semiconductor device 1a is an n-type transistor with a gate length of 20 nm. Furthermore, each portion is configured as follows. The insulating layer 3 is a $SiO_2$ film with a thickness of 145 nm, the cap layer 17 is a SiN film with a height of 50 nm, the fin 20 is a single-crystal Si with a height of 50 nm, the gate insulating film 12 is a SiON film with an Equivalent Oxide Thickness (EOT) of 1 nm, the metal layer 10a is a TiN film with a thickness of 50 nm having resistivity of 84 μΩ·cm, the semiconductor layer 10b is polycrystalline Si with a height of 90 nm having resistivity of 5000 μΩ·cm, and the silicide layer 16 is a NiSi film with a thickness of 50 nm having resistivity of 20-25μΩ·cm. Furthermore, a pitch of the fin 20 of the semiconductor device 100 is 50 nm.

Following TABLE 1 shows calculation results of the current gain cut-off frequencies $f_T$ and the power gain cut-off frequencies $f_{MAX}$ of each semiconductor device.

TABLE 1

|  | $f_T$ | $f_{max}$ |
|---|---|---|
| Semiconductor device 1a | 398 | 863 |
| Semiconductor device 100 | 398 | 651 |
| Semiconductor device 200 | 267 | 491 |

As understood from the TABLE 1, the power gain cut-off frequency $f_{MAX}$ of the semiconductor device 1a is large compared with that of the semiconductor device 100. This is because the average distance between the gate contact region 11 being an input part of a gate and each of the fins 20 in the semiconductor device 1a is shorter than that between a gate contact region 111 and each fin 120 in the semiconductor device 100, hence, the gate resistance $R_g$ is small.

The current gain cut-off frequency $f_T$ of the semiconductor device 1a is large compared with that of the semiconductor device 200. This is because the number of the gate contact regions 11 in the semiconductor device 1a is fewer than that of the gate contact regions 211 in the semiconductor device 200, hence, the gate input capacitance $C_{in}$ is small. Since the power gain cut-off frequency $f_{MAX}$ is proportional to the current gain cut-off frequency $f_T$, the power gain cut-off frequency $f_{MAX}$ of the semiconductor device 1a also becomes large compared with that of the semiconductor device 200.

As understood from the above-mentioned results, in the semiconductor device 1a according to this embodiment, it is possible to increase both of the current gain cut-off frequency $f_T$ and the power gain cut-off frequency $f_{MAX}$ by restraining the values of both of the gate resistance $R_g$ and the gate input capacitance $C_{in}$ to be small.

Second Embodiment

A second embodiment is different from the first embodiment in that the fins 20 compose a double closed loop structure. Note that, the explanation will be omitted to simplify for the points same as the first embodiment.

Figure 5:
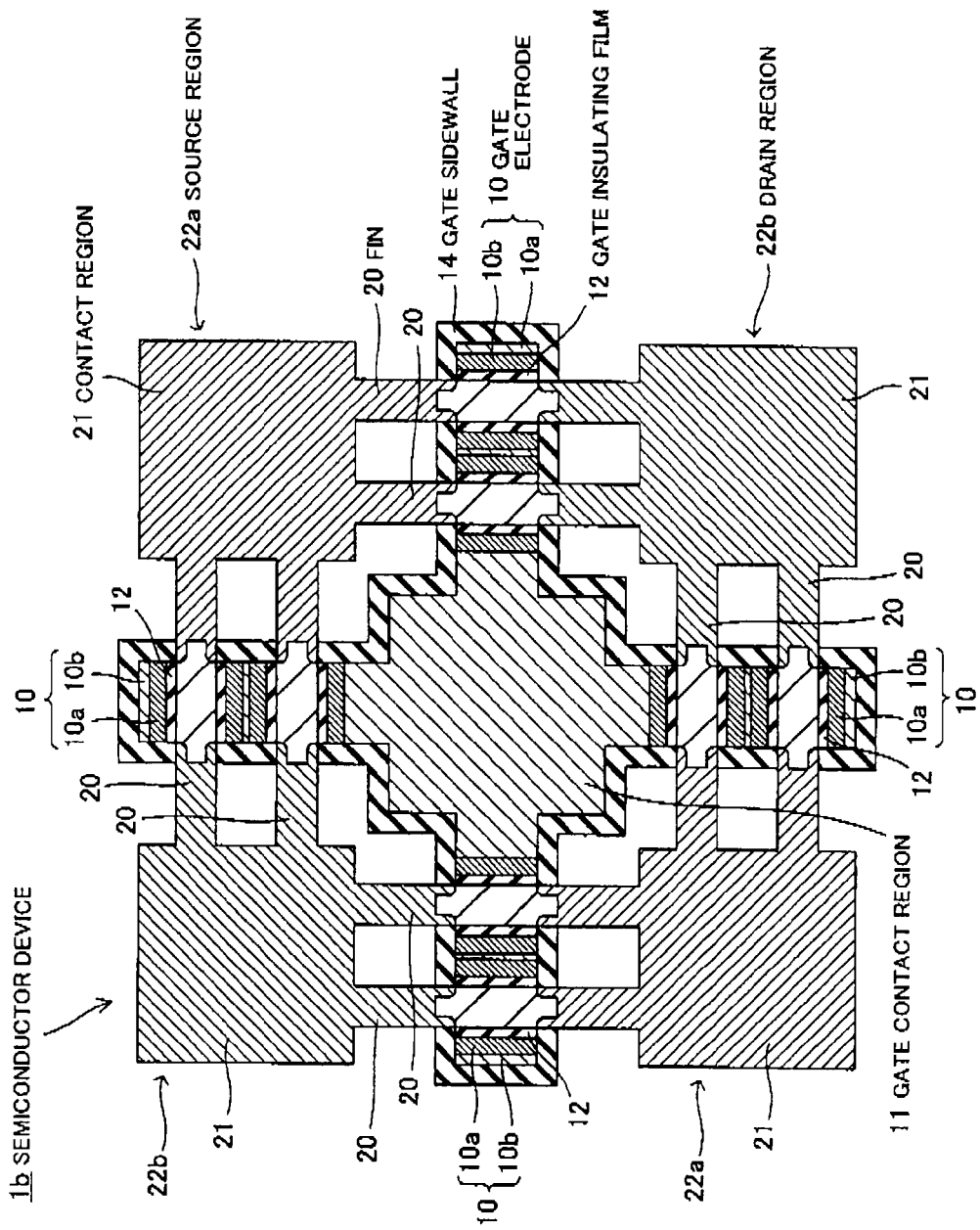
FIG. 5 is a cross sectional view of the semiconductor device according to a second embodiment.

FIG. 5 is a cross sectional view of the semiconductor device in the second embodiment. Note that, a cross section of the semiconductor device 1b according to this embodiment shown in FIG. 5 corresponds to a cross section of the semiconductor device 1a according to the first embodiment shown in FIG. 2.

In this embodiment, the closed loop structure formed of the four fins 20 is doubly formed and these closed loop structures are connected to each other via the contact regions 21. Namely, the fins 20 in pairs arranged in substantially parallel to each other compose a double closed loop structure by being continuously connected to one another via the four contact regions 21.

The gate electrodes 10 are formed so as to correspond to the fins 20 in pairs, respectively.

According to the second embodiment, the fins 20 compose a double closed loop structure for substantially increasing a gate width, thereby making possible to obtain a sufficient drive current.

Note that, the fins 20 may compose a closed loop structure of triple or more.

Third Embodiment

A third embodiment is different from the first embodiment in that there are six gate electrodes 10 and the fins 20 compose a hexagonal closed loop structure. Note that, the explanation will be omitted to simplify for the points same as the first embodiment.

Figure 6:
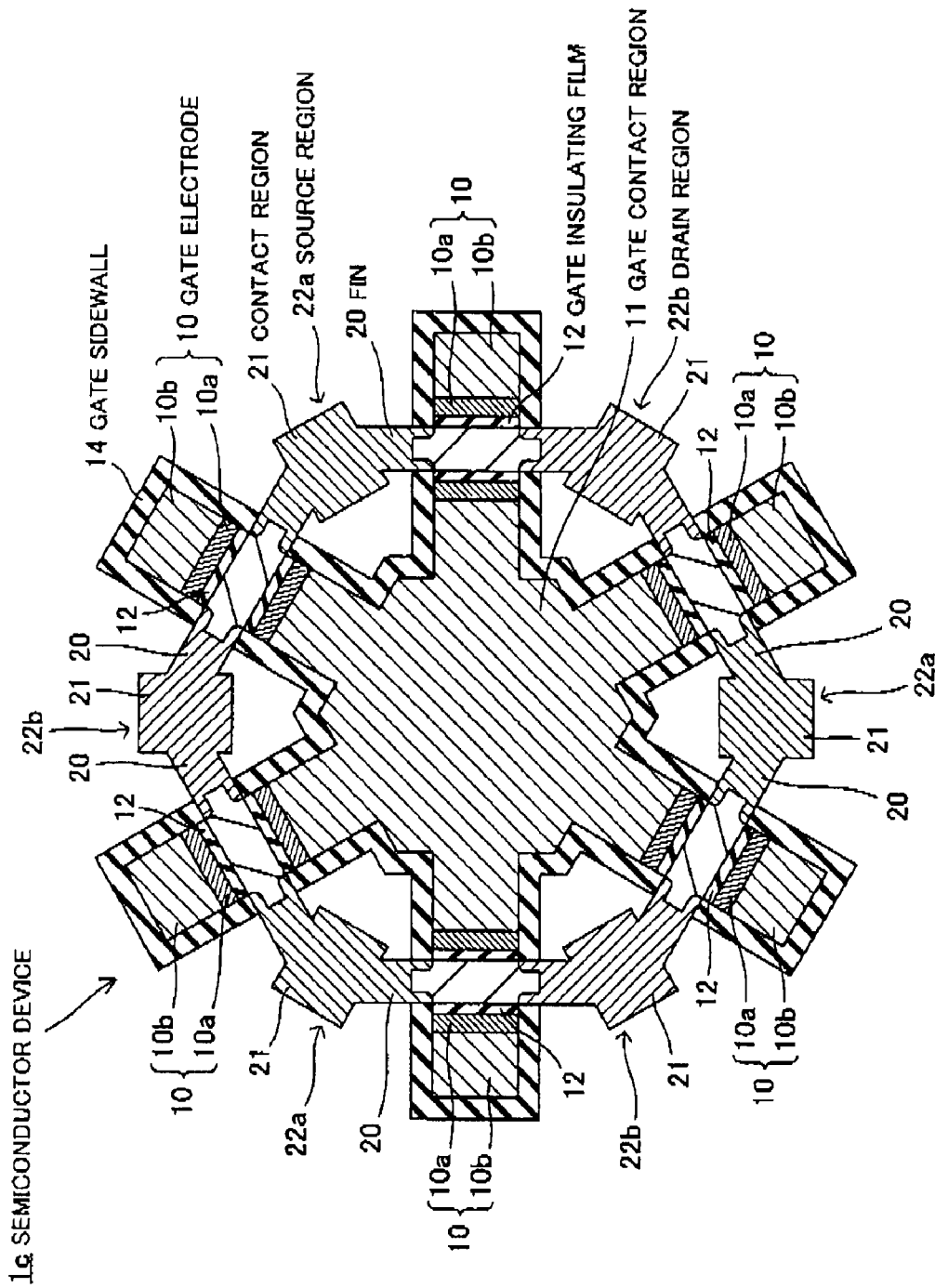
FIG. 6 is a cross sectional view of the semiconductor device according to a third embodiment.

FIG. 6 is a cross sectional view of the semiconductor device in the third embodiment. Note that, a cross section of the semiconductor device 1c according to this embodiment shown in FIG. 6 corresponds to a cross section of the semiconductor device 1a according to the first embodiment shown in FIG. 2.

In this embodiment, six fins 20 compose a hexagonal closed loop structure by being continuously connected to one another via six contact regions 21.

Note that, although a closed loop structure in a polygonal shape other than a hexagon may be composed, since it is necessary to alternately arrange the source regions 22a and the drain regions 22b, the number of corners in a polygon is preferably even number, namely, the numbers of the gate electrodes 10, the fins 20 and the contact regions 21 are even numbers for efficiently arranging the source regions 22a and the drain regions 22b in the closed loop structure.

Furthermore, in either cases, it is preferable that a closed loop structure composed by the fins 20 is a regular polygon and the gate contact region 11 is located at a center of the closed loop structure. In this case, the all distances (passing through in the gate electrodes 10) between the gate contact region 11 and regions sandwiched by the gate electrodes 10 of each fin 20 become equal.

Furthermore, the fins 20 may compose a multi polygonal closed loop structure by combining with the second embodiment.

According to the third embodiment, it is possible to obtain the same effect as the first embodiment even when the fins 20 composed a polygonal closed loop structure.

Other Embodiments

It should be noted that the present invention is not intended to be limited to the above-mentioned first to third embodiments, and the various kinds of changes thereof can be implemented by those skilled in the art without departing from the gist of the invention.

In addition, the constituent elements of the above-mentioned embodiments can be arbitrarily combined with each other without departing from the gist of the invention.

What is claimed is:

1. A semiconductor device, comprising:
    a substrate;
    a plurality of fins made of a semiconductor and formed on the substrate;
    a plurality of via contact regions formed between the fins, the plurality of via contact regions and the plurality of the fins constituting a closed loop structure;
    a gate contact region on the substrate arranged at a position surrounded by the closed loop structure;
    a plurality of gate electrodes connected to the gate contact region respectively, each of the plurality of gate electrodes sandwiching both side faces of each of the plurality of fins between its opposite regions via gate insulating film; and
    source/drain regions formed in regions in the plurality of fins and in the via contact region, the source/drain regions being formed on both sides of a region sandwiched by the gate electrodes along longitudinal direction of the fin.

2. The semiconductor device according to claim 1, wherein the plurality of fins comprise multiple closed loop structures connected each other via the via contact region; and
    the plurality of gate electrodes are formed so as to respectively correspond to the fins of which number is equal to the number of the closed loop structures.

3. The semiconductor device according to claim 1, wherein even numbers of the gate electrodes, the contact regions and the fins are formed, respectively.

4. The semiconductor device according to claim 3, wherein four of the gate electrodes and four of the contact regions are formed, and the closed loop structure is tetragonal.

5. The semiconductor device according to claim 2, wherein even numbers of the gate electrodes, the contact regions and the fins are formed, respectively.

6. The semiconductor device according to claim 5, wherein four of the gate electrodes and four of the contact regions are formed, and the multi closed loop structure is tetragonal.

7. The semiconductor device according to claim 2, wherein the multi closed loop structure is a double closed loop structure.

8. The semiconductor device according to claim 5, wherein the multi closed loop structure is a double closed loop structure.

9. The semiconductor device according to claim 6, wherein the multi closed loop structure is a double closed loop structure.

10. The semiconductor device according to claim 1, wherein the closed loop structure is a regular polygon; and
    the gate contact region is located at a center of the closed loop structure.

11. The semiconductor device according to claim 10, wherein the closed loop structure is a regular hexagon.

12. The semiconductor device according to claim 2, wherein the multi closed loop structure is a regular polygon, and the gate contact region is located at a center of the multi closed loop structure.

13. The semiconductor device according to claim 12, wherein the multi closed loop structure is a regular hexagon.

14. The semiconductor device according to claim 1, wherein a silicide layer is formed on upper portions of the plurality of gate electrodes.

15. The semiconductor device according to claim 1, wherein each of the plurality of the gate electrodes is arranged so as to extend in a direction orthogonal to each of the plurality of the fins from the gate contact region.

16. The semiconductor device according to claim 1, wherein each of the plurality of gate electrodes comprises metal layer and semiconductor layer formed on the metal layer.

17. The semiconductor device according to claim 1, wherein distances between the gate contact region and the plurality of fins are substantially uniform.

18. The semiconductor device according to claim 1, wherein each of the contact regions includes a source/drain region being shared by FinFETs comprising the two fins adjacent to each of the contact regions.

19. The semiconductor device according to claim 1, wherein the gate insulating film is also formed between the upper surface of each of the plurality of fins and each of the plurality of gate electrodes.

20. The semiconductor device according to claim 1, wherein the distances between each of the contact regions and the gate electrodes formed on the fins adjacent to each of the contact regions are substantially uniform.

* * * * *